US010268373B2

(12) United States Patent
Manabe

(10) Patent No.: US 10,268,373 B2
(45) Date of Patent: Apr. 23, 2019

(54) STORAGE SYSTEM WITH IMPROVED COMMUNICATION

(71) Applicant: Toshiba Memory Corporation, Minato-ku, Tokyo (JP)

(72) Inventor: Shinichiro Manabe, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 18 days.

(21) Appl. No.: 14/698,297

(22) Filed: Apr. 28, 2015

(65) Prior Publication Data

US 2016/0259556 A1 Sep. 8, 2016

Related U.S. Application Data

(60) Provisional application No. 62/128,390, filed on Mar. 4, 2015.

(51) Int. Cl.
G06F 3/06 (2006.01)
G11C 5/14 (2006.01)
G11C 16/10 (2006.01)
G11C 16/30 (2006.01)

(52) U.S. Cl.
CPC ............ G06F 3/0604 (2013.01); G06F 3/065 (2013.01); G06F 3/0679 (2013.01); *G11C 5/144* (2013.01); *G11C 16/102* (2013.01); *G11C 16/30* (2013.01)

(58) Field of Classification Search
USPC ........................................................ 711/103
See application file for complete search history.

(56) References Cited

U.S. PATENT DOCUMENTS

| 8,555,090 B2* | 10/2013 | Hagiwara ............... G06F 1/30 713/300 |
| 9,823,862 B2* | 11/2017 | Kinoshita .......... G06F 3/0688 |
| 2004/0230862 A1* | 11/2004 | Merchant ............. G06F 3/0607 714/6.12 |
| 2010/0241783 A1* | 9/2010 | Garcia ............... G06F 13/1684 711/5 |
| 2012/0117354 A1* | 5/2012 | Tatsumura .......... H04L 12/6418 711/200 |
| 2013/0111117 A1* | 5/2013 | Yang ...................... G06F 3/061 711/103 |

(Continued)

Primary Examiner — Tracy A Warren
(74) Attorney, Agent, or Firm — White & Case LLP

(57) ABSTRACT

According to one embodiment, there is provided a storage system comprising a storage unit including a memory unit, the memory unit including a nonvolatile memory, a controller and a first issuance unit, wherein the controller controls the nonvolatile memory. The system also comprises a connection unit which controls the storage unit. Further the system comprises a first power supply unit which supplies a first power supply voltage to the storage unit and/or to the connection unit, the first power supply voltage being generated by converting an external power supply voltage. Additionally, the system comprises a management unit which monitors power supply information based on the first power supply voltage. The connection unit issues a first write request for writing first data to the memory unit, and the first issuance unit issues, to the connection unit, first information associated with the first data of the write request.

21 Claims, 10 Drawing Sheets

(56) References Cited

U.S. PATENT DOCUMENTS

2013/0254240 A1* 9/2013 Kurita ............... G06F 17/30584
707/802
2015/0193264 A1* 7/2015 Hutton ..................... G06F 9/54
719/328

* cited by examiner

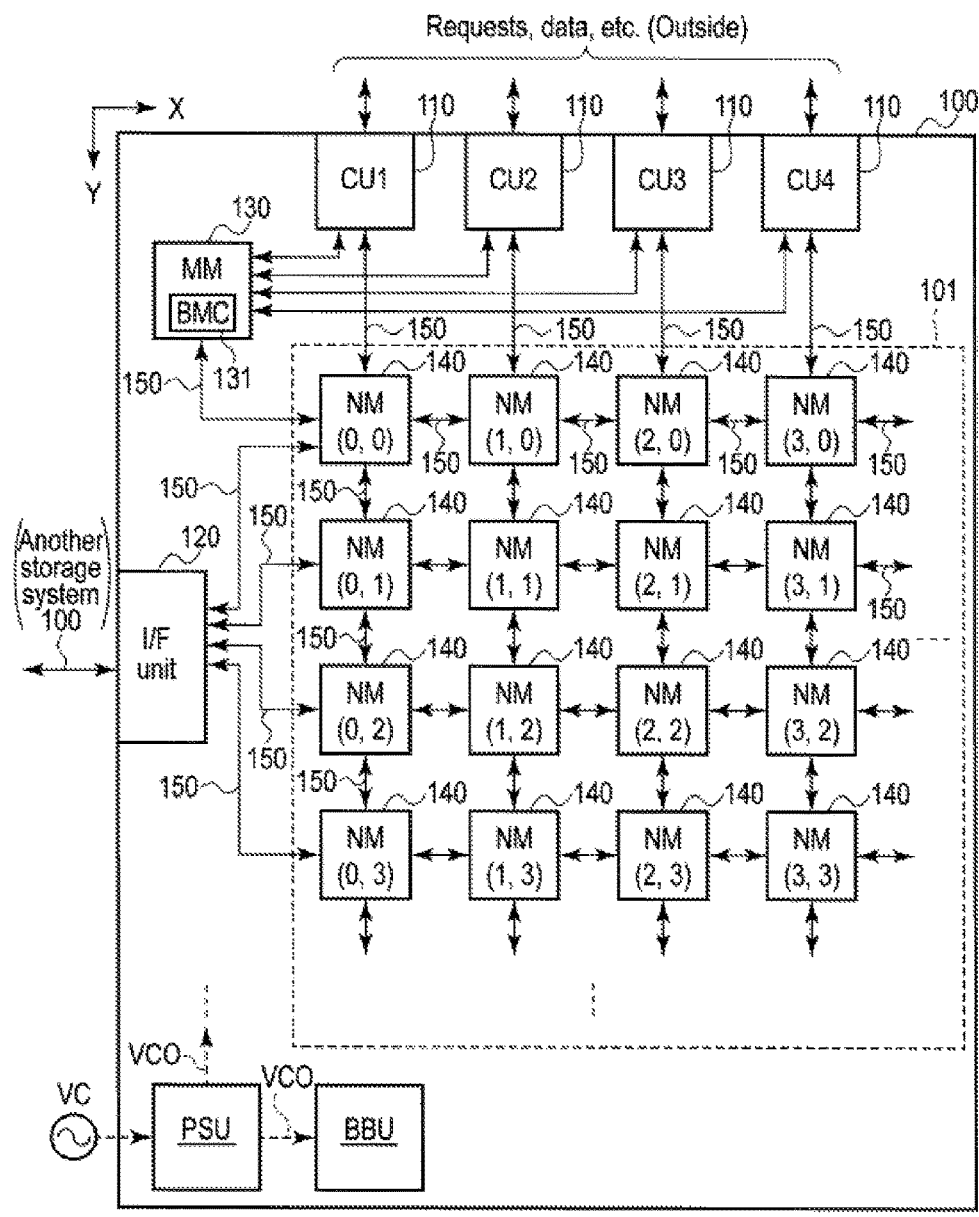
F I G. 1

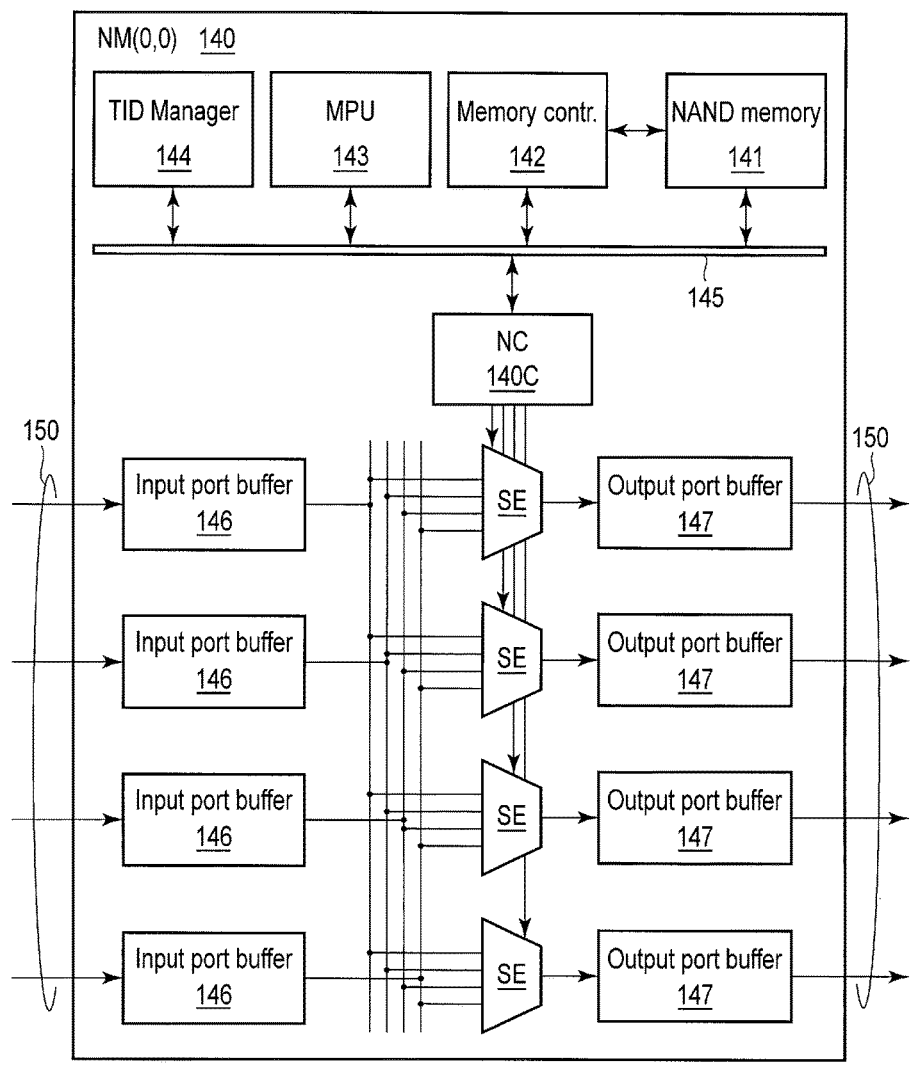
F I G. 3

Data format (NM(2,0))

```
(TID:DATA)
    1:A1"ABCDE":followed by TID 4 of NM (1, 1)
    2:A2"FG":followed by TID 3 of NM (1, 1)
    3:A3"J"
    4:A4"U"
    5:A5"X"
```

F I G. 8A

Data format (NM(1,1))

```
(TID:DATA)
    1:B1"KLMNO"
    2:B2"PQRST"
    3:B3"HI":followed by TID 3 of NM (2, 0)
    4:B4"V"
    5:B5"Y":followed by TID 3 of NM (2, 2)
```

F I G. 8B

Data format (NM(2,2))

```
(TID:DATA)
    1:C1"Z01"
    2:C2"Z02"
    3:C3"Z03"
    4:C4"Z04"
    5:C5"Z05"
```

F I G. 8C

Data format (NM (2, 0)) (Modification example 1)

```
(TIDb:DATA)
   1:A1"AAA"
   2:A2"BACK":followed by TIDb 3 of NM (1, 1)
   3:A3"BBB"
   ~
   800:A800"GGG"
```

F I G. 12A

Data format (NM (1, 1)) (Modification example 1)

```
(TIDb:DATA)
   1:B1"CCC"
   2:B2"EEE"
   3:B3"UP"
   ~
   1000:B1000"FFF"
```

F I G. 12B

STORAGE SYSTEM WITH IMPROVED COMMUNICATION

CROSS-REFERENCE TO RELATED APPLICATIONS

This application claims the benefit of U.S. Provisional Application No. 62/128,390, filed Mar. 4, 2015, the entire contents of which are incorporated herein by reference.

FIELD

Embodiments relate generally to a storage system.

BACKGROUND

There is a case where a plurality of information processing apparatuses including a storage system are connected to each other through a network to configure a single information processing system. An example of the information processing system is a cloud computing system. In recent years, there has been an increasing tendency to make use of data such as cloud data in an information processing system.

BRIEF DESCRIPTION OF THE DRAWINGS

FIG. 1 is a block diagram showing the overall structure of a storage system according to a first embodiment;

FIG. 3 is a block diagram showing the detailed structure of an NM according to the first embodiment;

FIG. 8A shows an example of the data format of NM (2, 0);

FIG. 8B shows an example of the data format of NM (1, 1);

FIG. 8C shows an example of the data format of NM (2, 2);

FIG. 12A shows an example of the data format of NM (2, 0) according to modification example 1; and FIG. 12B shows an example of the data format of NM (1, 1) according to modification example 1.

DETAILED DESCRIPTION

Figure 2:
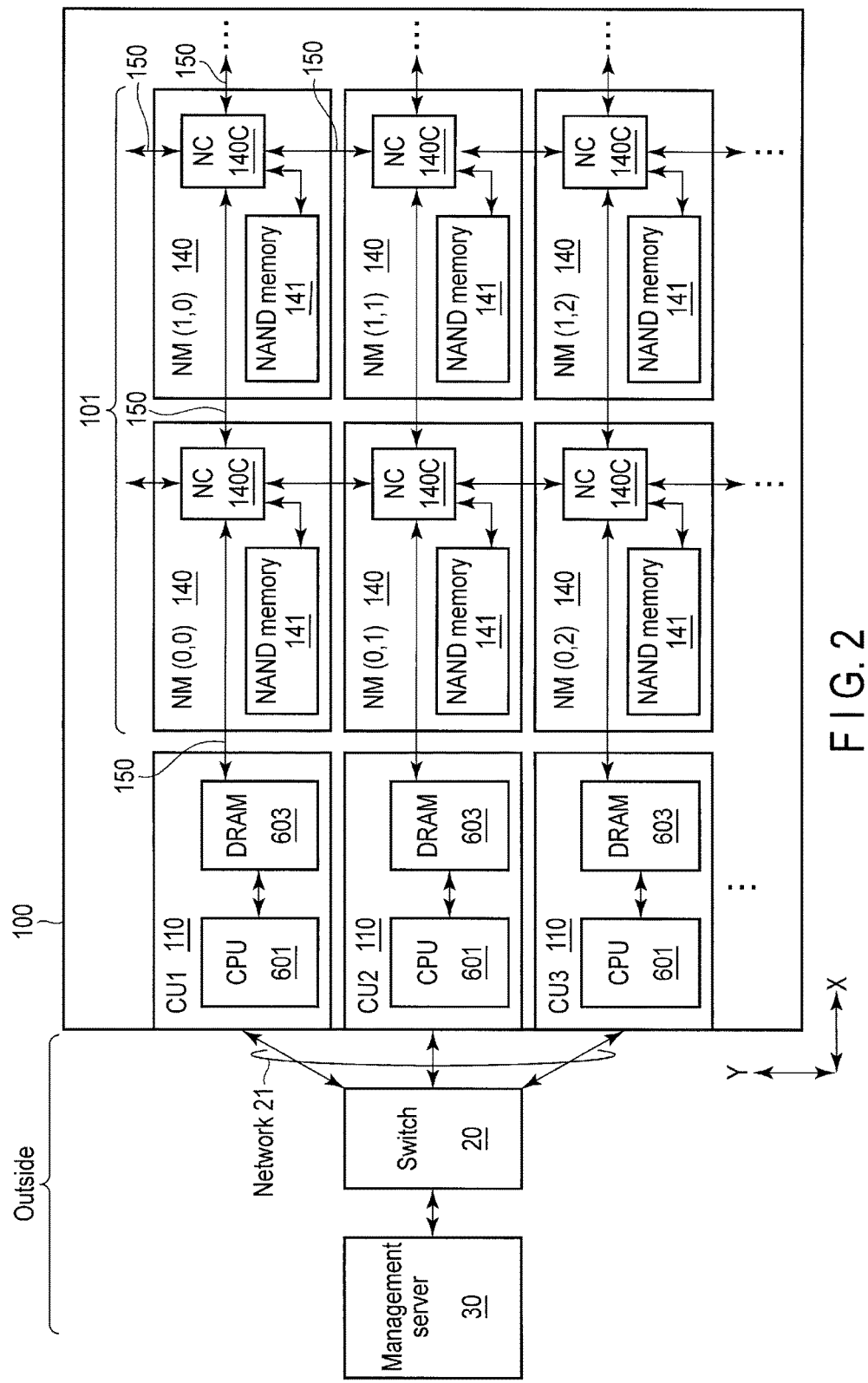
FIG. 2 is a block diagram shown for explaining the detailed structure of the storage system according to the first embodiment.

In general, according to one embodiment, a storage system includes a storage unit including a memory unit, the memory unit including a nonvolatile memory and a controller which controls the nonvolatile memory; a connection unit which connects the storage unit to outside and controls the storage unit; and a management unit which at least monitors power supply voltages of the storage unit and the connection unit. The storage unit further includes a first issuance unit which issues first data associated with data stored in the nonvolatile memory.

Various embodiments will be described hereinafter with reference to the accompanying drawings.

In the following descriptions, the same reference number is added to substantially the same function or element to describe it when necessary. In the specification of the present application, some elements are each given by different expressions. These expressions are merely an example and the elements can be given by other expressions. Elements that are not given by different expressions can also be given by other expressions.

First Embodiment

1. Structure

[1-1. Overall Structure (Storage System)]

First, the overall structure of a storage system 100 of a first embodiment is briefly described with reference to FIG. 1.

As shown in FIG. 1, the storage system 100 of the first embodiment comprises a storage unit 101, connection units (CU 1 to CU 4) 110, an interface (I/F) unit 120, a management module (MM) 130, a power supply unit PSU and a battery backup unit BBU.

[Storage Unit]

The storage unit 101 comprises a plurality of node modules (NM) 140 which are arranged in a matrix state. This arrangement enables the storage unit 101 to store data items such that they are dispersed to the plurality of NMs 140 and to process the data items dispersedly and parallelly.

Each NM (memory unit) 140 transfers a packet including data transferred from connection units (CU) 110, another NM 140, etc., in a predetermined mode through a mesh-like network. Each NM 140 comprises two or more interfaces 150. Each NM 140 is electrically connected to its adjacent NM 140 via the interface 150. Each NM 140 may be electrically connected to its adjacent NM 140 via a routing circuit (RC) or a packet management unit (PMU), not shown in the Figures.

FIG. 1 shows an example of a rectangular network in which the NMs 140 are arranged at their respective lattice points. Here, the coordinates of each of the lattice points are represented by (x, y) in decimal notation. Assume that the positional information of an NM 140 located at a lattice point is represented by a relative node address $(x_D, y_D)$ (=decimal notation) which corresponds to the coordinates of the lattice point. In the example shown in FIG. 1, the NM 140 located in the upper left corner has a node address (0, 0) of the origin. The relative node address of each NM 140 increases or decreases with variations of integral values in the horizontal direction (X direction) and vertical direction (Y direction).

Each NM 140 is connected to its adjacent NM 140 in two or more different directions. For example, the NM 140 (0, 0) located in the upper leftmost corner is connected to the adjacent NM 140 (1, 0) in the X direction and the adjacent NM 140 (0, 1) in the Y direction different from the X direction. Hereinafter, an NM 140 represented by a relative node address $(x_D, y_D)$ may be simply referred to as a node $(x_D, y_D)$.

In FIG. 1, the NMs 140 are shown such that they are arranged at their respective lattice points of a rectangular lattice; however, the arrangement form of the NMs 140 is not limited to this example. In other words, as a shape of the lattice, each NM 140 located at a lattice point has only to be connected to its adjacent NM 140 in two or more different directions. For example, the shape may be a triangle or a hexagon. In FIG. 1, the NMs 140 are arranged in a two-dimensional fashion; however, they may be arranged in a three-dimensional fashion. When the NMs 140 are arranged in a three-dimensional fashion, each of the NMs 140 can be designated by three values (x, y, z). When the NMs 140 are arranged in a two-dimensional fashion, they may be connected in a torus fashion by connecting the NMs 140 located on opposite sides to each other. Packets may be transferred via a routing circuit (RC), not shown in the Figures. The detailed structure of the NMs 140 is described later.

[Connection Units (CU 1 to CU 4)]

Each of CU1 to CU4 (system controllers) 110 comprises a predetermined connector connectable to an external user in order to store data in the storage unit 101 and output data to outside from the storage unit 101 in accordance with a request (a command, an address, etc.,) from outside. Specifically, each of CU 1 to CU 4 comprises an arithmetic unit and a memory unit which are described later. The arithmetic unit of CU 1 to CU 4 executes a server application program, using the memory unit as a work area.

CU 1 to CU 4 process a request from outside under the control of the server application. During the processing of the request from outside, CU 1 to CU 4 access the storage unit 101. When CU 1 to CU 4 access the storage unit 101, CU 1 to CU 4 generate a packet that can be transferred and executed by the NMs 140, and transmit the generated packet to the NMs 140 connected to CU 1 to CU 4, respectively.

In the example of FIG. 1, the storage system 100 comprises four CUs 110 (CU 1 to CU 4). The four CUs 110 are connected to different NMs 140, respectively.

While FIG. 1 depicts a storage system 100 with four CUs 110, a storage system 100 according to the present disclosure may encompass any number of CUs 110. Each of CUs 110 can be connected to an arbitrary routing circuit (RC), not shown in the Figures, or NM 140 included the storage unit 101. One CU 110 may be connected to a plurality of routing circuits (RC), not shown in the Figures, or NMs 140, and one routing circuit (RC), not shown in the Figures, may be connected to a plurality of CUs 110. CUs 110 are described in detail later.

[Interface (I/F) Unit]

The I/F unit 120 is a connection interface for expanding the storage unit 101. For example, two storage systems 100 which are physically different can be electrically connected to each other via the I/F unit 120. With this connection, the storage units 101 of the storage systems 100 are logically coupled to each other to be used as a single storage unit 101. The I/F unit 120 is electrically connected to one or more NMs 140 or routing circuits (RC) via the interfaces 150. Here, the interfaces 150 connected to four NMs 140, respectively, are connected to the I/F unit 120.

[Management Module (MM)]

The MM 130 is electrically connected to each CU 110, an NM 140 and a routing circuit (RC), not shown in the Figures. The MM 130 comprises a baseboard management controller (BMC) 131. As some of the functions of the BMC 131, for example, the MM 130 monitors an environment temperature, monitors and controls the number of rotations of a fan, monitors and controls a power supply current and a power supply voltage, records the status of each CU 110, monitors the temperature of each CU 110 and resets CUs 110.

In addition to the functions of the BMC 131, the MM 130 performs a process (NM control process) for the storage unit 101. The NM control process includes an arbitrary process suited the type of NM 140. If, for example, an NM 140 comprises a NAND type flash memory (hereinafter, referred to as a NAND memory) as described later, the MM 130 may perform wear leveling of the NAND type flash memory. When trouble, e.g. failure, of an NM 140 is detected, the MM 130 may notify the outside, such as the management server 30, that a card board on which the NM 140 that failed is mounted should be replaced, through CUs 110.

Node controllers (NC) 140C, described later, or CUs 110 may detect trouble of the NMs 140. The detection of trouble of an NM 140 may be performed based upon detection of an error of read data from the NAND memory included in the NM 140. When the MM 130 performs the NM control process for the storage unit 101, the MM 130 issues a packet corresponding to the process. The MM 130 issues a packet that conforms to the pattern of the packet issued by the NMs 140.

The MM 130 may perform the following controls depending on the need:

management of network setup for each structural unit (101, 110, 120, etc.,) (for example, management of IP addresses);

management of authentication of external users (specifically, management of user names or authorization which are allowed to access the storage system 100);

data backup and restore control;

display of trouble of the NMs 140 or CUs 110 of the storage system 100, if any, on a predetermined display device, and notification of the trouble to an external user;

management of system information such as time (specifically, management of countries in which the storage system 100 is used, summer time, etc.);

drive management (for example, management of the drive structure formed by all of the NMs 140); and LED control (for example, LED display of error information and LED display of status).

[Power Supply Unit (PSU)]

The power supply unit (a main power supply unit or a first power supply unit) PSU converts an external power supply voltage which is supplied from an external power supply VC into a predetermined DC voltage, and supplies a power supply voltage VCO corresponding to the DC voltage to each unit or module (101, 110, 120 and 130). The external power supply VC is an AC power supply of, for example, 100 V and 200 V. The storage system 100 of the first embodiment comprises two power supply units PSU-1 and PSU-2. However, the structure of the power supply unit PSU is not limited to this example.

[Battery Backup Unit (BBU)]

The battery backup unit (an auxiliary power supply unit or a second power supply unit) BBU receives a power supply voltage VCO from the power supply unit PSU, stores it in the BBU and generates a predetermined auxiliary power supply voltage. When the storage system 100 is electrically shut off from the external power supply VC, the battery backup unit BBU supplies an auxiliary power supply voltage to each unit or module (101, 110, 120 and 130). For example, even if a power failure occurs, and a power supply voltage from the external power supply VC is stopped, the battery backup unit BBU supplies an auxiliary power supply voltage to the aforementioned units or modules to operate the storage unit 101. The node controllers (NC) 140C included in the NMs 140 write (or copy) user data to the NAND memory, using the supplied auxiliary power supply voltage. In this manner, the user data is protected.

[Interface Standard]

In the first embodiment, the following standards can be applied to the interfaces via which the aforementioned units or modules are electrically connected.

First, for example, a low voltage differential signaling (LVDS) standard is applied to interfaces 150 via which the NMs 140 are connected to each other.

For example, a PCI Express (PCIe) standard is applied to interfaces 150 via which the NMs 140 and CUs 110 are electrically connected to each other.

For example, the above LVDS standard and a joint test action group (JTAG) standard are applied to interfaces 150 via which the NMs 140 and the I/F unit 120 are electrically connected to each other.

The above PCIe standard and an inter-integrated circuit (I2C) standard are applied to interfaces 150 via which the NMs 140 and the MM 130 are electrically connected to each other.

These standards are merely examples, and naturally other standards can be applied when necessary.

[1-2. Detailed Structures of CUs 110 and Storage Unit 101]

Next, this specification explains examples of the detailed structures of CUs 110 and the storage unit 101 with reference to FIG. 2. Here, as examples of CUs 110, three CU 1 to CU 3 are shown.

As shown in FIG. 2, each CU 110 comprises a CPU 601 which is an arithmetic unit, and a DRAM 603 which is a memory unit. The central processing unit (CPU) 601 comprises a predetermined connector electrically connectable to outside and controls the storage unit 101. Specifically, the CPU 601 writes data to the storage unit 101 and reads the data from the storage unit 101 to outside in accordance with a request (a command, an address, etc.,) from outside. The dynamic random access memory (DRAM) 603 is a volatile semiconductor memory used as a work area by the CPU 601.

The CPU 601 executes a server application program, using the DRAM 603 as a work area. The CPU 601 processes a request from outside under the control of the server application. During the processing of the request from outside, the CPU 601 accesses the storage unit 101. When the CPU 601 accesses the storage unit 101, the CPU 601 generates a packet that can be transferred and executed by the NMs 140, and transmits the generated packet to the NM 140 connected to the CPU 601.

The structure of CUs 110 is not limited to this example. For example, each CU 110 may naturally comprise a static random access memory (SRAM) and a read-only memory (ROM) depending on the need.

Each NM 140 comprises a NAND memory 141 and the node controller (NC) 140C. The NAND memory 141 stores data of the transferred packet in a nonvolatile manner based on the control of the NC 140C. The NAND memory 140 reads the stored data based on the control of the NC 140C. The NAND memory 141 erases the stored data based on the control of the NC 140C. In the above structure, a field-programmable gate array (FPGA) may comprise four NMs 140 and one routing circuit.

The storage system 100 is electrically connected to a switch 20 through a predetermined network 21. The switch 20 is a structure provided outside the storage system 100. The switch 20 selects the CU to be connected to a management server 30 from the plurality of CU 1 to CU 3 and connects it to the management server 30.

The management server 30 is electrically connected to CU 1 to CU 3 via the switch 20. The management server 30 transmits a predetermined request to the storage system 100 via the switch 20 and controls the operation of the storage system 100 as a whole.

[1-3. Detailed Structure of NMs 140]

Next, an example of the detailed structure of the NMs 140 is described with reference to FIG. 3. Here, the structure of NM (0, 0) is shown as an example of the NMs 140.

As shown in FIG. 3, the NM 140 of the first embodiment comprises the NAND memory 141, a memory controller 142, an MPU 143, a TID manager 144, input port buffers 146, output port buffers 147, selectors SE and the NC 140C.

The NAND memory 141 is electrically connected to a control line (internal bus line) 145 and the memory controller 142. The NAND memory 141 comprises a plurality of memory cells MC located at intersections between a plurality of word lines and a plurality of bit lines. Each memory cell MC comprises a control gate CG connected to a word line, and a floating gate FG in which data is stored.

The memory controller 142 accesses the NAND memory 141 based on the control of the NC 140C. For example, the memory controller 142 writes data described in a packet to the NAND memory 141 based on the control of the NC 140C. The memory controller 142 reads data from the NAND memory 141 based on the control of the NC 140C.

The micro processing unit (MPU) 143 controls the operation of the NM 140 as a whole via the control line 145.

The TID manager 144 controls issuance of a TID (transfer identification, first information) associated with write data described in a write request, described later, based on the control of the NC 140 and the MPU 143. The "transfer identification (TID)" may be information which is at least associated with write data described in write requests and stored in the NAND memory 141. In other words, at least, a TID may be a unique identifier associated with write data stored in the NM 140. For example, a TID is represented by numbers, alphabets or combination of them.

The input port buffers (input packet memory units) 146 temporarily store a packet input from the input interfaces 150 and transmit the packet to the inputs of the selectors SE connected to the input port buffers 146, respectively. Here, four input buffers 146 are provided, corresponding to four input interfaces 150.

The output port buffers (output packet memory units) 147 temporarily store a packet input from the selectors SE and output the packet to the output interfaces 150. Here, four output buffers 147 are provided, corresponding to four output interfaces 150.

The selectors (selection units) SE transmit the packet input from the input buffers 146 to the output buffers 147 based on a control signal transmitted by the NC 140C.

The NC 140C controls the packet transfer and the whole operation of the NM 140 via the control line 145 as stated above.

[1-4. Packet Structure]

Next, an example of the packet structure is described. The packet of the first embodiment includes a header area, a payload area and a redundant area.

In the header area, for example, the X- and Y-direction address (from_x, from_y) of a source of transmission and the X- and Y-direction address (to_x, to_y) of a destination of transmission are described.

In the payload area, for example, a command or data is described. The data size of the payload area PA is variable.

In the redundant area, for example, a cyclic redundancy check (CRC) code is described. The CRC code is a code (data) used for detecting an error of data in the payload area PA.

2. Operation

[2-1. Data Write Operation]

Next, on the basis of the structures, this specification explains the data write operation of the storage system 100 according to the first embodiment. The explanation is given with reference to the flowchart shown in FIG. 4. Here, this specification explains the data write operation of two CU 1 and CU 2 and three NM (2, 0), NM (1, 1) and NM (2, 2) as an example.

Figure 4:
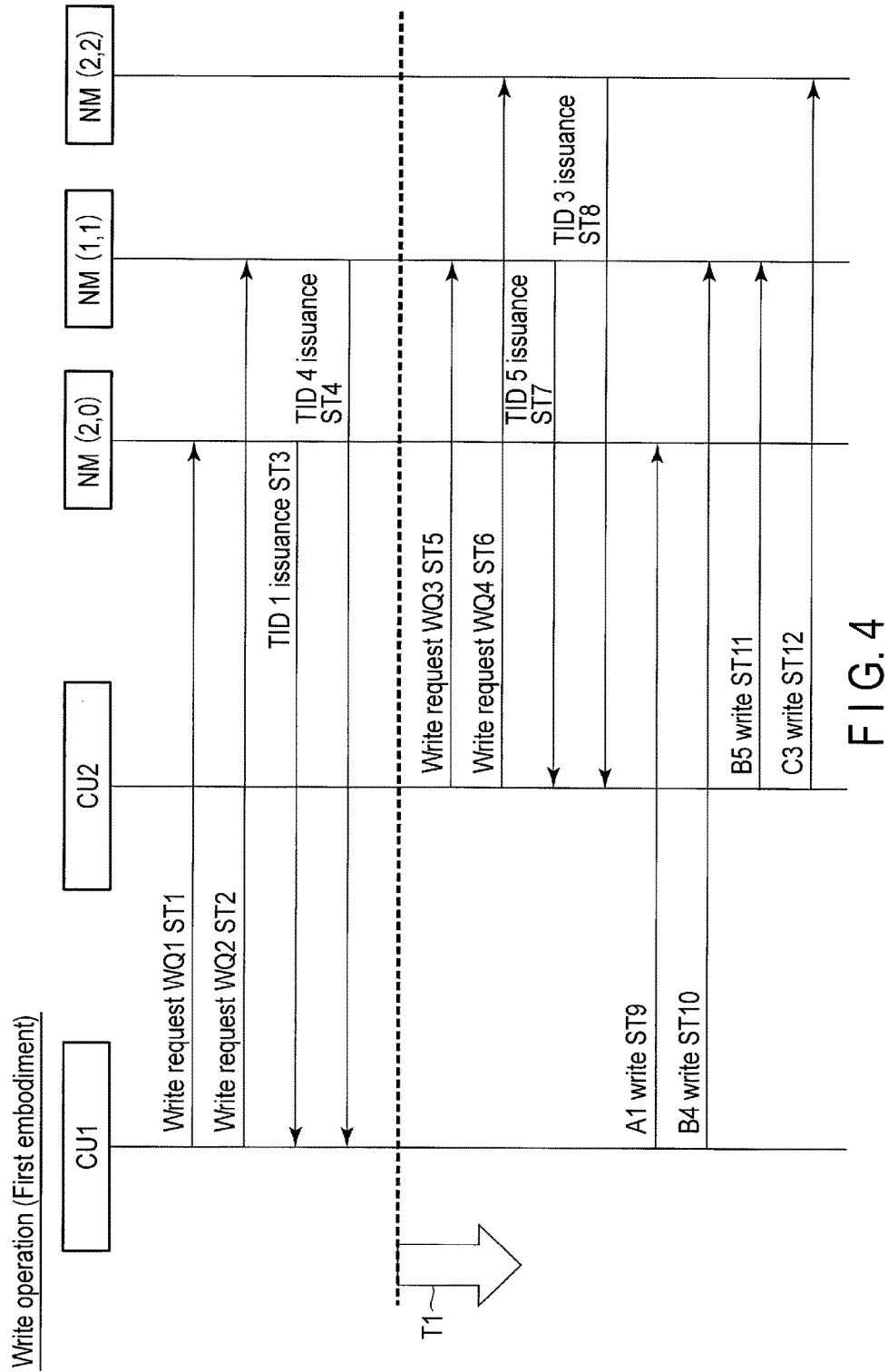
FIG. 4 is a flowchart showing a write operation according to the first embodiment.

As shown in FIG. 4, in steps ST1 and ST2, CU 1 makes write requests WQ1 and WQ2 for writing predetermined write data relative to NM (2, 0) and NM (1, 1). Specifically, the CPU 601 of CU 1 issues, to NM (2, 0) and NM (1, 1), packets related to write requests WQ1 and WQ2 in which write commands, write data, addresses and the like are described, respectively.

Figure 5:
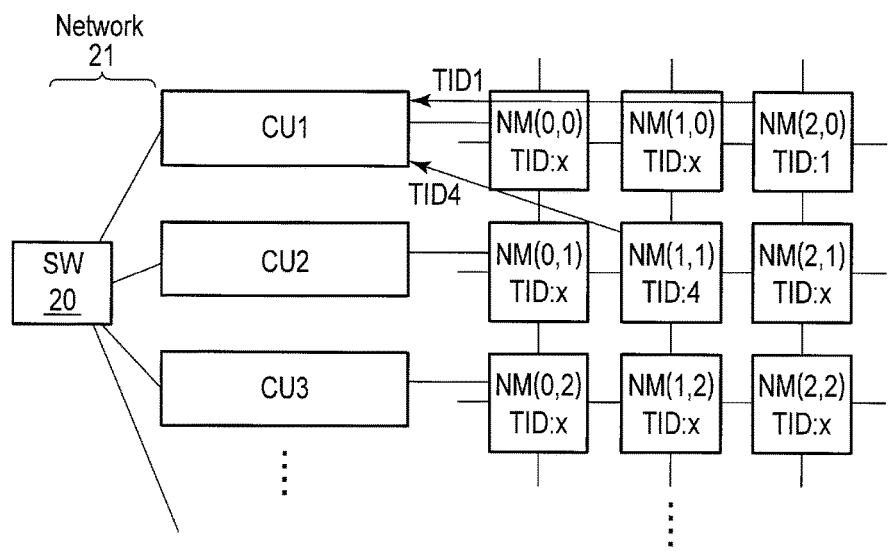
FIG. 5 is a block diagram showing a process for issuing a TID according to the first embodiment.

In steps ST3 and ST4, NM (2, 0) and NM (1, 1) which received write requests WQ1 and WQ2 issue TID 1 and TID 4, respectively, to CU 1. Specifically, as shown in FIG. 5, the TID manager 144 of NM (2, 0) which received write request WQ1 issues TID 1 associated with write data related to write request WQ1 to CU 1. Similarly, the TID manager 144 of NM (1, 1) which received write request WQ2 issues TID 4 associated with write data related to write request WQ2 to CU 1.

The issued TID 1 and TID 4 are associated with (tied to) write requests WQ1 and WQ2, respectively, and are stored in a predetermined memory unit included in CU 1.

Figure 6:
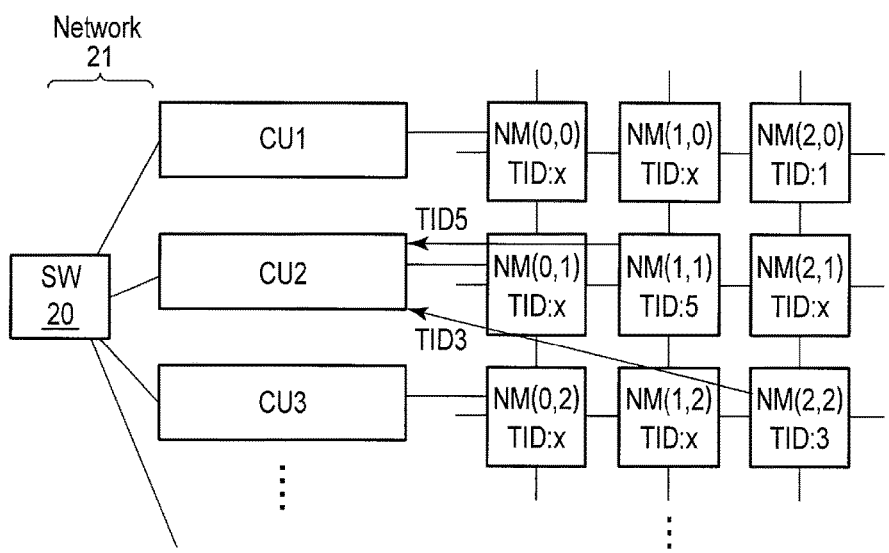
FIG. 6 is a block diagram showing a process for issuing a TID according to the first embodiment.

Two CU 1 and CU 2 can operate parallely during period T1 after steps ST3 and ST4 as TID 1 and TID 4 have been issued. In steps ST5 and ST6, CU 2 makes write requests WQ3 and WQ4 for writing predetermined write data relative to NM (1, 1) and NM (2, 2) in a similar manner. In steps ST7 and ST8, NM (1, 1) and NM (2, 2) which received write requests WQ3 and WQ4 issue TID 5 and TID 3, respectively, to CU 2. Specifically, as shown in FIG. 6, the TID manager 144 of NM (1, 1) which received write request WQ3 issues TID 5 associated with write data related to write request WQ3 to CU 2. Similarly, the TID manager 144 of NM (2, 2) which received write request WQ4 issues TID 3 associated with write data related to write request WQ4 to CU 2. The issued TID 5 and TID 3 are associated with (tied to) write requests WQ3 and WQ4, respectively, and are stored in a predetermined memory unit included in CU 1 in a similar manner. With regard to NM (1, 1), write request WQ2 from CU 1 and write request WQ3 from CU 2 overlap with each other. Thus, adjustment of the manner in which data is written to NM (1,1) is required. In the first embodiment, exclusive control is performed by using TID 4, associated with WQ2, and TID 5, associated with WQ3, both TID 4 and TID 5 being issued by the TID manager 144 of NM (1, 1) to CU 1 and CU 2. In this manner, adjustment is made where data items associated with the correct TIDs are issued to the respective CUs. Write requests WQ2 and WQ3 which overlap in NM (1, 1) can be adjusted as explained below.

In steps ST9 and ST10, CU 1 writes, to NM (2, 0) and NM (1, 1), write data A1 and B4 which are related to write requests WQ1 and WQ2 and are associated with TID 1 and TID 4, respectively.

Figure 7:
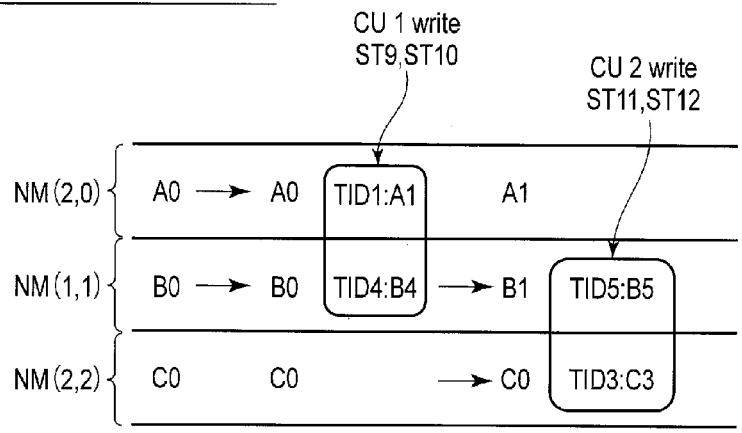
FIG. 7 shows NM data change according to the first embodiment.

Specifically, as shown in FIG. 7, CU 1 controls the NC 140C of NM (2, 0) such that write data A1 associated with TID 1 is written to the NAND memory 141 of NM (2, 0). Based on the control of the NC 140C, the memory controller 142 of NM (2, 0) writes write data A1 associated with (tied to) TID 1 to the NAND memory 141. Similarly, CU 1 controls the NC 140C of NM (1, 1) such that write data B4 related to write request WQ2 is written to the NAND memory 141 of NM (1, 1). Based on the control of the NC 140C, the memory controller 142 of NM (1, 1) writes write data B4 associated with (tied to) TID 4 to the NAND memory 141.

In steps ST11 and ST12, CU 2 writes, to NM (1, 1) and NM (2, 2), write data B5 and C3 which are related to write requests WQ3 and WQ4 and are associated with TID 5 and TID 3, respectively.

Specifically, as shown in FIG. 7, CU 2 controls the NC 140C of NM (1, 1) such that write data B5 which is related to write request WQ3 and is associated with TID 5 is written to the NAND memory 141 of NM (1, 1) under the control of NC 140C. Based on the control of the NC 140C by CU 2, the memory controller 142 of NM (1, 1) writes write data B5 associated with (tied to) TID 5 to the NAND memory 141. Similarly, CU 2 controls the NC 140C of NM (2, 2) such that write data C3 which is related to write request WQ4 and is associated with TID 3 is written to the NAND memory 141 of NM (2, 2). Based on the control of the NC 140C by CU 2, the memory controller 142 of NM (2, 2) writes write data C3 associated with (tied to) TID 3 to the NAND memory 141. In essence, NC 140C operates under the control of CU 2, and the memory controller 142 operates under the control of NC 140C. Under such control, the memory controller 142 writes write data to the NAND memory 141.

[2-2. Data Read Operation]

Next, this specification explains the data read operation of the storage system 100 of the first embodiment after the above data write operation.

[Data Format of NMs 140 after Data Write]

First, this specification explains the data format of the NMs 140 after the above data write with reference to FIG. 8A to FIG. 8C. FIG. 8A shows an example of the data format stored in the NAND memory 141 of NM (2, 0) after the above data write. FIG. 8B shows an example of the data format stored in the NAND memory 141 of NM (1, 1) after the above data write. FIG. 8C shows an example of the data format stored in the NAND memory 141 of NM (2, 2) after the above data write.

As shown in FIG. 8A, in NM (2, 0), write data A1 "ABODE" is formatted in association with TID 1. Further, write data A1 is formatted as "followed by TID 4 of NM (1, 1)". Write data A2 "FG" is formatted in association with TID 2. Further, write data A2 is formatted as "followed by TID 3 of NM (1, 1)". Write data A3 "J" is formatted in association with TID 3. Write data A4 "U" is formatted in association with TID 4. Write data A5 "X" is formatted in association with TID 5.

As shown in FIG. 8B, in NM (1, 1), write data B1 "KLMNO" is formatted in association with TID 1. Write data B2 "PQRST" is formatted in association with TID 2. Write data B3 "HI" is formatted in association with TID 3. Further, write data B3 is formatted as "followed by TID 3 of NM (2, 0). Write data B4 "V" is formatted in association with TID 4. Write data B5 "Y" is formatted in association with TID 5. Further, write data B5 is formatted as "followed by TID 3 of NM (2, 2)".

As shown in FIG. 8C, in NM (2, 2), write data C1 "Z01" is formatted in association with TID 1. Write data C2 "Z02" is formatted in association with TID 2. Write data C3 "Z03" is formatted in association with TID 3. Write data C4 "Z04" is formatted in association with TID 4. Write data C5 "Z05" is formatted in association with TID 5.

Thus, in each NM 140, write data is paired up with a TID. In this data format, the write data is stored in the NAND memory 141. The write data shown in the figures is stored according to a ring buffer system.

In the above data format, new write data is written to each NM 140 in series in a similar manner. At this time, old data (in other words, data having a small TID) is not deleted and remains as long as the data capacity of the NAND memory 141 allows it.

By specifying a TID, data associated with the specified TID, in short, target data, is read from the NAND memory 140 of the NM 140. For example, when TID 4 is specified relative to NM (2, 0), data A4 "U" associated with TID 4 is read from NM (2, 0).

Write data may not be actual user data. Write data may be a series of data items which are not completed by a single NM 140 and range over two or more NMs 140. In the case of a series of data items, information indicating which TID follows a data item of the series of data items and in which NM 140 the TID is included is also described to complete the series of data items.

For example, when TID 2 is specified relative to NM (2, 0), data A2 "FG" associated with TID 2 is read from NM (2, 0) in a similar manner. Data A2 is formatted as "followed by TID 3 of NM (1, 1)". Subsequently, data B3 "HI" associated with TID 3 is read from NM (1, 1). Further, data B3 is formatted as "followed by TID 3 of NM (2, 0)". Subsequently, data A3 "J" associated with TID 3 is read from NM (2, 0)". As a result, data A2, B3 and A3 "FGHIJ" is read as a series of data items.

When a data read is requested without specifying any TID, data (latest data) which was formatted last in each NM 140 is read. For example, when a data read is requested without specifying any TID relative to NM (2, 0), data A5 "X", which is the latest data, is read.

The data read operation is explained in detail in the next section.

[Data Read Operation]

Next, the data read operation of the data-formatted NMs 140 is explained with reference to the flowchart shown in FIG. 9. Here, this specification explains the data read operation of two CU 1 and CU 2 and three NM (2, 0), NM (1, 1) and NM (2, 2) as an example.

Data is written in association with TIDs before period T2 described below. Therefore, for example, the read order is arbitrary in period T2 described below.

First, in step ST21, CU 1 makes read request RQ1 relative to NM (2, 0), specifying TID 1. Specifically, the CPU 601 of CU 1 issues, to NM (2, 0), a packet related to write request RQ1 in which TID 1, a read command, etc., are described.

In step ST22, NM (2, 0) which received read request RQ1 reads data A1 "ABCDE" associated with TID 1 and transmits the read data A1 "ABCDE" to CU 1. Specifically, the NC 140C of NM (2, 0) analyzes the description of the packet related to read request RQ1 and determines whether or not TID 1 described in the packet coincides with TID 1 issued by its TID manager 144. If they coincide with each other, the NC 140C reads data A1 "ABCDE" associated with TID 1 from the NAND memory 141 and transmits the read data to CU 1. As shown in FIG. 8A, data A1 is formatted as "followed by TID 4 of NM (1, 1)".

Therefore, in step ST23, NM (1, 1) reads data B4 "V" associated with TID 4 and transmits the read data B4 "V" to CU 1.

Thus, in the data read operation of the first embodiment, it is possible to read a series of data items A1 and B4 "ABCDEV" written based on write requests WQ1 and WQ2 by merely specifying TID 1 relative to NM (2, 0).

In step ST24, similarly, CU 2 makes read request RQ2 relative to NM (1, 1), specifying TID 5. Specifically, the CPU 601 of CU 2 issues, to NM (1, 1), a packet related to read request RQ2 in which TID 5, a read command, etc., are described.

In step ST25, NM (1, 1) which received read request RQ2 reads data B5 "Y" associated with TID 5 and transmits the read data B5 "Y" to CU 2. Specifically, the NC 140C of NM (1, 1) analyzes the description of the packet related to read request RQ2 and determines whether or not TID 5 described in the packet coincides with TID 5 issued by its TID manager 144. If they coincide with each other, the NC 140C reads data B5 "Y" associated with TID 5 from the NAND memory 141 and transmits the read data to CU 2. As shown in FIG. 8B, data B5 is formatted as "followed by TID 3 of NM (2, 2)".

Therefore, in step ST26, NM (2, 2) reads data C3 "Z03" associated with TID 3 and transmits the read data C3 "Z03" to CU 2.

Thus, in the data read operation of the first embodiment, it is possible to read a series of data items B5 and C3 "YZ03" written based on write requests WQ2 and WQ4 by merely specifying TID 5 relative to NM (1, 1).

In step ST27, CU 1 makes read request RQ3 relative to NM (2, 2) in a similar manner without specifying any TID. Specifically, the CPU 601 of CU 1 issues, to NM (2, 2), a packet related to read request RQ3 in which no TID is described and a read command and the like are described.

In step ST28, as no TID is specified, NM (2, 2) which received read request RQ3 reads the latest data C5 "Z05" and transmits the read data C5 "Z05" to CU 2.

3. Advantageous Effect

As explained above, the structure and operation of the storage system 100 of the first embodiment allow at least acquisition of the following advantageous effects (1) and (2).

(1) It is possible to reduce the communication load of the network 21 and disperse the load of data processing.

This effect is explained by comparing the first embodiment with multi-version concurrency control (MVCC).

A) MVCC

MVCC is a technique for allowing a plurality of computers to concurrently access a distributed storage while maintaining data consistency. In MVCC, it is necessary to sequentially manage the order in which all update processes were performed. Therefore, in MVCC, a management server collectively manages an ID for managing a transaction process which consists of writing and reading data.

However, in the above MVCC and ID management, every time an update process occurs in the distributed storage, there is a need to access the management server which manages the update process through a network. In this case, accesses from the distributed storage flock to the management server. Thus, the communication load of the network is considerably increased.

In addition, as the communication load of the network is increased, the communication speed is decreased. In this manner, the merit of distribution of distributed storage could be lost.

B) First Embodiment

On the other hand, in the storage system 100 of the first embodiment, each NM 140 comprises the TID manager 144 which controls TID issuance based on the control of the NC 140 and the MPU 143 (FIG. 3).

According to the above structure, each NM 140 is capable of managing TID issuance. Thus, there is no need to obtain a TID from the management server 30 every time CU 110 accesses the NM 140. It is possible to reduce the communication load of the network 21.

For example, in the data write operation shown in FIG. 4, write request WQ2 from CU 1 overlaps with write request WQ3 from CU 2 with respect to NM (1, 1).

In the first embodiment, the TID manager 144 of NM (1, 1) issues TID 4 and TID 5 to CU 1 and CU 2, respectively (steps ST4 and ST7 in FIG. 4). Subsequently, CU 1 and CU 2 write, to NM (1, 1), write data B4 and B5 which are related to write requests WQ2 and WQ4 and are associated with TID 4 and TID 5, respectively (steps ST9 and ST11).

Thus, even if write requests WQ2 and WQ3 which overlap with each other are generated in NM (1, 1), it is possible to perform exclusive control and adjust the process regardless of the management server 30. As a result, the communication load of the network 21 can be reduced.

In addition, each NM 140 which is dispersedly arranged in a matrix state manages TIDs. This allows the load of data processing to be dispersed. The merit of distribution of the storage unit 101 can be maximized.

(2) It is possible to maintain data consistency.

As explained above, in the storage system 100 of the first embodiment, write data is formatted in association with a TID (FIG. 8A to FIG. 8C). In the data format, when a TID is specified in a data read, the target data is read from the NAND memory 140 of the NM 140 in association with the specified TID.

Figure 9:
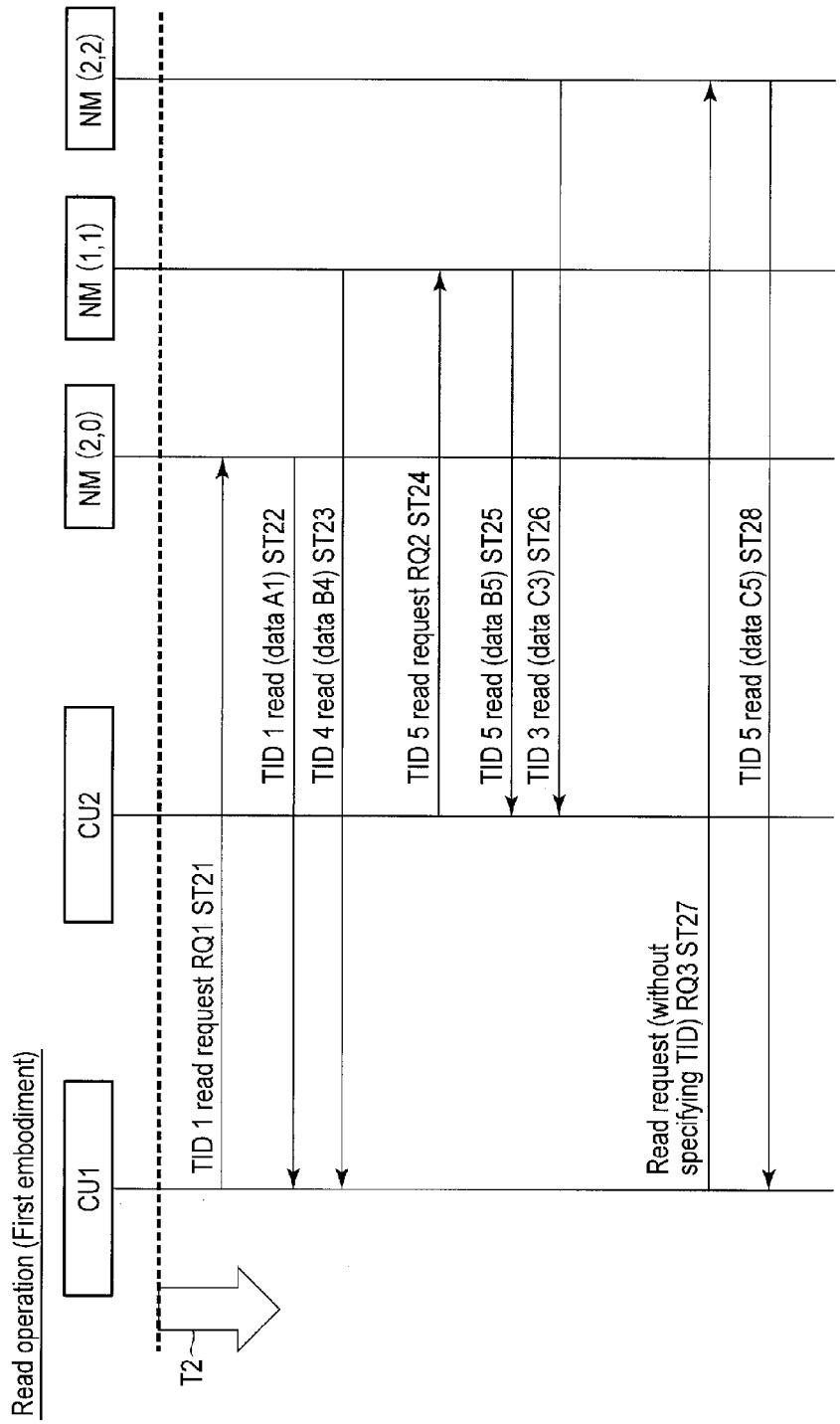
FIG. 9 is a flowchart showing a read operation according to the first embodiment.

As an example, this specification explains a case where CU 1 makes read request RQ1 relative to NM (2, 0), specifying TID 1, in the data read operation shown in FIG. 9. In this case, NM (2, 0) which received read request RQ1 reads data A1 "ABCDE" associated with TID 1 and transmits the read data A1 "ABCDE" to CU 1 (step ST22 in FIG. 9). Further, as shown in FIG. 8A, data A1 is formatted as "followed by TID 4 of NM (1, 1)". Therefore, NM (1, 1) reads data B4 "V" associated with TID 4 and transmits the read data B4 "V4" to CU 1 (step ST23).

In this manner, in the data read operation of the first embodiment, a series of data items A1 and B4 "ABCDEV" written based on write requests WQ1 and WQ2 can be read by merely specifying TID 1 relative to NM (2, 0).

Thus, according to the storage system 100 of the first embodiment, it is possible to manage a transaction process which consists of writing and reading data regardless of the management server 30. The consistency of a series of data items can be maintained.

Second Embodiment [Example of Backup Process]

Figure 11:
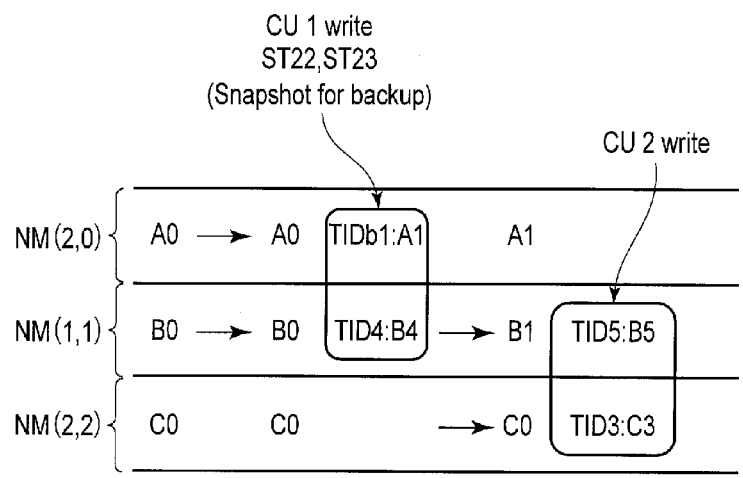
FIG. 11 shows NM data change according to the second embodiment.
Figure 10:
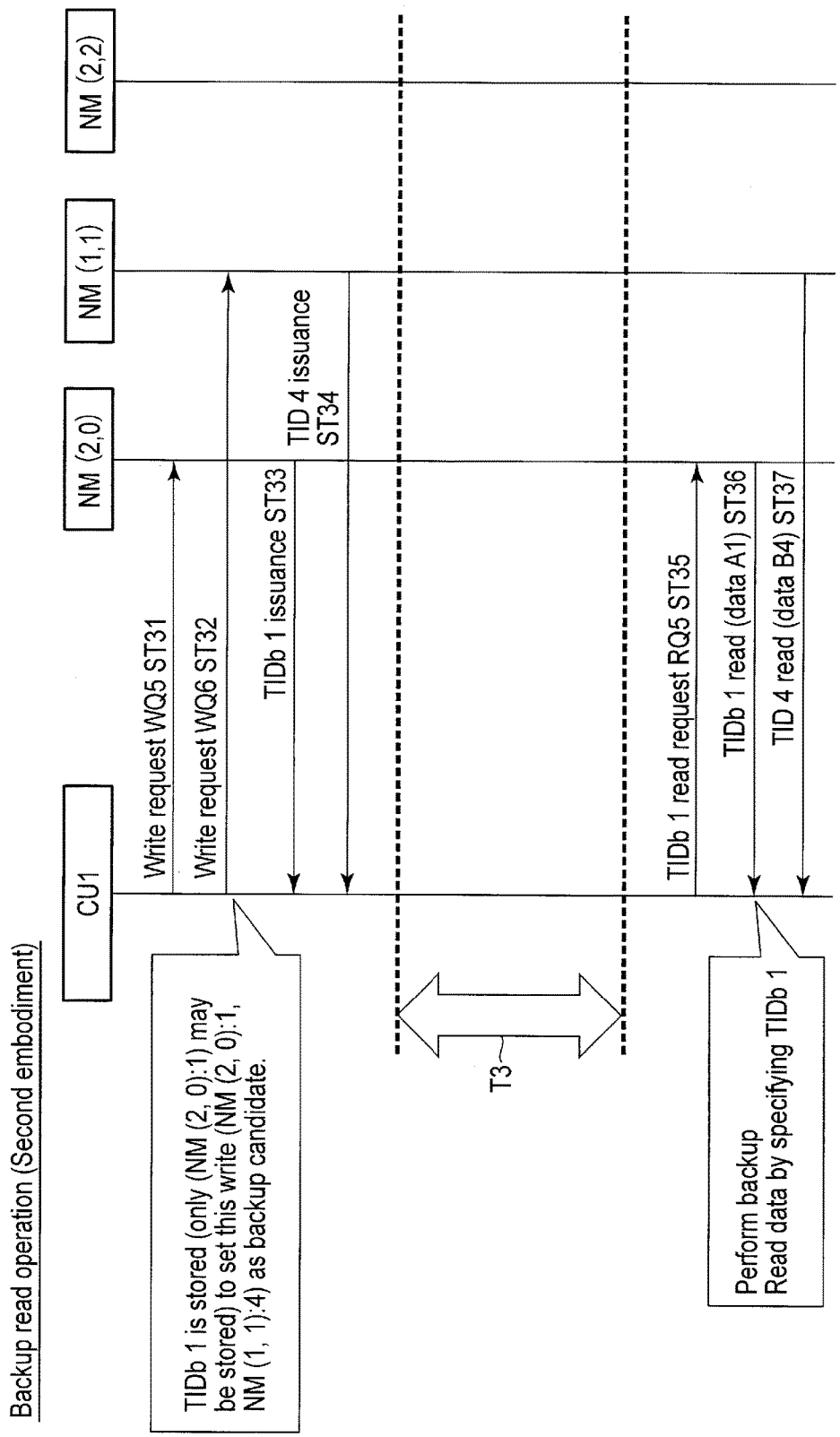
FIG. 10 is a flowchart showing an operation for reading backup data according to a second embodiment.

Next, this specification explains a storage system 100 of a second embodiment with reference to FIG. 10 and FIG. 11. The second embodiment relates to an example of a backup process of writing data. Hereinafter, the detailed description of portions that overlap with those of the first embodiment is omitted.

[Structure]

In the storage system 100 of the second embodiment, a TID manager 144 comprises an issuance unit (second issuance unit) which controls issuance of a special TIDb (second information) for backup at the time of writing data. In this respect, the storage system 100 of the second embodiment is different from that of the first embodiment. A "TIDb" may be information which can be at least associated with backup data stored in a NAND memory 141.

In the second embodiment, a special TIDb for backup is determined in advance between CU 110 and a storage unit 101. This determination allows backup data to be read by specifying a TIDb for backup when needed. The detail of this operation is explained later.

The other structures are substantially the same as those of the first embodiment. Thus, the detailed explanation of such structures is omitted.

[Backup Read Operation]

Next, this specification explains the operation for reading backup data in the memory system 100 of the second embodiment with reference to FIG. 10.

As shown in steps ST31 and ST32, CU 1 makes write requests WQ5 and WQ6 relative to NM (2, 0) and NM (1, 1) in a similar manner. Specifically, a CPU 601 of CU 1 issues, to NM (2, 0) and NM (1, 1), packets related to write requests WQ5 and WQ6 in which write commands, write data, addresses, etc., are described, respectively.

In step ST33, NM (2, 0) which received write request WQ5 issues a special TIDb 1 for back up to CU 1. Specifically, the issuance unit of the TID manager 144 of NM (2, 0) which received write request WQ5 issues, to CU 1, TIDb 1 for backup associated with write data for back up related to write request WQ5. The issued TIDb 1 is stored in a predetermined storage unit included in CU 1.

In step ST34, NM (1, 1) which received write request WQ6 issues TID 4 to CU 1 in a similar manner. Specifically, the TID manager 144 of NM (1, 1) which received write request WQ6 issues, to CU 1, TID 4 associated with write data related to write request WQ6. The issued TID 4 is stored in a predetermined storage unit included in CU 1.

As stated above, a TIDb for backup may be transmitted to CU 1 in response to, of a series of write requests WQ5 and WQ6, the first request WQ5.

Subsequently, data write is performed with respect to write requests WQ5 and WQ6 in a similar manner.

Specifically, as shown in FIG. 11, CU 1 controls an NC 140C of NM (2, 0) in a similar manner such that write data A1 associated with TIDb 1 for backup is written to the NAND memory 141 of NM (2, 0). Similarly, CU 1 controls the NC 140C of NM (1, 1) such that write data B4 related to write request WQ6 is written to the NAND memory 141 of NM (1, 1).

TIDb 1 and TID 4 are issued before period T3 following step ST34. Therefore, CU 1 and CU 2 are capable of making other requests depending on the need regardless of write requests WQ5 and WQ6. For example, as shown in FIG. 11, similarly to the first embodiment, CU 2 can write write data B5 and C3 associated with TID 5 and TID 3 to NM (1, 1) and NM (2, 2), respectively.

FIG. 10 is referred to again. In step ST35, similarly, CU 1 makes data read request RQ5 relative to NM (2, 0), specifying TIDb 1 for backup. Specifically, the CPU 601 of CU 1 issues, to NM (2, 0), a packet related to read request RQ5 in which TIDb 1, a read command, etc., are described.

In step ST36, NM (2, 0) which received read request RQ5 reads data A1 for backup associated with TIDb 1 for back up and transmits the read data A1 for backup to CU 1. Specifically, the NC 140C of NM (2, 0) analyzes the description of the packet related to read request RQ5 and determines whether or not TIDb 1 for backup described in the packet coincides with TIDb 1 issued by the issuance unit of its TID manager 144. If they coincide with each other, the NC 140C reads data A1 associated with TIDb 1 from the NAND memory 141 and transmits the read data to CU 1. As shown in FIG. 8A, data A1 is formatted as "followed by TID 4 of NM (1, 1)".

Therefore, in step ST37, NM (1, 1) reads data B4 associated with TID 4 and transmits the read data B4 to CU 1.

The other operations are substantially the same as those of the first embodiment. Thus, the detailed explanation of such operations is omitted.

[Advantageous Effect]

As explained above, the structure and operation of the storage system 100 of the second embodiment allow at least acquisition of advantageous effects similar to the above effects (1) and (2). In addition, the following advantageous effect (3) can be obtained from the second embodiment.

(3) Convenience can be improved.

The TID manager 144 of the storage system 100 of the second embodiment further comprises an issuance unit which issues a special TIDb for backup at the time of writing data.

In this manner, a special TIDb for backup is determined in advance between CU 110 and the storage unit 101 and is issued. It is possible to read data for backup by specifying the TIDb when needed.

Specifically, as shown in FIG. 10, the issuance unit of the TID manager 144 of NM (2, 0) which received write request WQ5 issues, to CU 1, TIDb 1 for backup associated with write data for backup related to write request WQ5. The issued TIDb 1 is stored in a predetermined storage unit included in CU 1 (ST33). Subsequently, in a similar manner, CU 1 makes data read request RQ5 relative to NM (2, 0), specifying TIDb 1 for backup when needed (ST35). Subsequently, NM (2, 0) which received read request RQ5 reads data A1 for backup associated with TIDb 1 for backup and transmits the read data A1 for backup to CU 1 (ST36).

Thus, a TIDb for backup is determined as specific ID data compared to a normal TID between a host 20 and the memory system 100. Therefore, for example, even if CU 2 which is different from the source of issuance redundantly writes data to NM (2, 2) after a TIDb for backup is issued, backup data associated with the TIDb for backup is retained in NM (2, 2). In this case, even while or after CU 2 which is different from the source of issuance writes data to an arbitrary NM 140, CU 1 which is the source of issuance can easily read data for backup by merely specifying the TIDb for backup.

With the structure and operation of the second embodiment, for example, it is possible to read the past file data or the snapshots of all of the past data in a similar manner. Thus, application as backup can be realized. As a result, convenience can be improved.

Modification Example 1 [Another Example of Backup Data Read]

This specification explains the storage system 100 of modification example 1 with reference to FIG. 12A and FIG. 12B. Modification example 1 is another example of backup data read and relates to an example in which write data at a time point is reused as backup data. Hereinafter, the detailed description of portions that overlap with those of the first and second embodiments is omitted.

[Structure]

In the storage system 100 of modification example 1, the TID manager 144 comprises an issuance unit which issues a special TIDb for backup at the time of writing data in a manner similar to the second embodiment.

[Data Format of NMs 140 after Data Write]

Next, this specification explains the data format of the NMs 140 after writing data in modification example 1 with reference to FIG. 12A and FIG. 12B. FIG. 12A shows the data format stored in the NAND memory 141 of NM (2, 0) after writing data. FIG. 12B shows the data format stored in the NAND memory 141 of NM (1, 1) after writing data. Here, as an example, this specification explains a case where the number of TIDbs for backup is considerably increased after NM (2, 0) and NM (1, 1) are used by CU 110 as the storage units for backup data.

As shown in FIG. 12A, in NM (2, 0), write data A1 "AAA" is formatted in association with TIDb 1 for backup. Write data A2 "BACK" is formatted in association with TIDb 2. Further, write data A2 is formatted as "followed by TIDb 3 of NM (1, 1)". Write data A3 "BBB" is formatted in association with TIDb 3. Subsequently, write data is formatted in this manner. Lastly, write data A800 "GGG" is formatted in association with TIDb 800.

As shown in FIG. 12B, in NM (1, 1), write data B1 "CCC" is formatted in association with TIDb 1 for backup. Write data B2 "EEE" is formatted in association with TIDb 2. Write data B3 "UP" is formatted in association with TIDb 3. Subsequently, write data is formatted in this manner. Lastly, write data B1000 "FFF" is formatted in association with TIDb 1000.

As stated above, in modification example 1, the number of TIDbs for backup is considerably increased (TIDb 800 and TIDb 1000). For example, when the data capacity of NM (2, 0) is approximately 100 GB, and the average data size of write data A1 to A800 is approximately 1 MB, the remaining data capacity of backup data associated with TIDbs for backup is approximately a hundred thousand B with respect to the past data write in NM (2, 0).

CU 110 has only to store a TIDb for backup and an NM 140 corresponding to the TIDb for backup in its memory. Thus, CU 110 does not need to store the actual backup data (for example, data A1 "AAA") in its memory. This operation is explained in detail later.

The other structures are substantially the same as those of the first and second embodiments. Thus, the detailed explanation of such structures is omitted.

[Backup Read Operation]

Next, this specification explains the operation for reading backup data in the memory system 100 according to modification example 1.

This specification considers a case where CU 1 reads backup data A1 of NM (2, 0) (NM (2,0): TIDb 1) in the data formats shown in FIG. 12A and FIG. 12B. In this case, CU 1 specifies TIDb 1 for backup relative to NM (2, 0). NM (2, 0) reads backup data A1 "AAA" associated with TIDb 1 for backup and transmits the read data A1 back to CU 1.

This specification considers a case where CU 1 reads backup data A2 of NM (2, 0) (NM (2, 0): TIDb 2). In this case, CU 1 specifies TIDb 2 for backup relative to NM (2, 0). NM (2, 0) reads backup data A1 "BACK" associated with TIDb 2 for backup and transmits the read backup data A1 back to CU 1.

Further, data A2 for backup is formatted as "followed by TID 3 of NM (1, 1)". Therefore, subsequently, backup data B3 "UP" associated with TIDb 3 is read from NM (1, 1). The read backup data B3 is transmitted to CU 1.

As a result, as a series of backup data items, data A2 and B3 "BACKUP" is read and transmitted to CU 1.

The other operations are substantially the same as those of the first and second embodiments. Thus, the detailed explanation of such operations is omitted.

[Advantageous Effect]

As explained above, the structure and operation of the storage system 100 of modification example 1 allow at least acquisition of advantageous effects similar to the above effects (1) to (3). In addition, modification example 1 allows backup data to be read depending on the need even if the number of TIDbs for backup is considerably increased.

Naturally, the data format is not limited to the data formats explained in the first embodiment, the second embodiment and modification example 1. As an example of the data format, naturally, TIDs and TIDbs for backup may be mixed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage system comprising:
   a first unit including a first nonvolatile memory;
   a second unit including a second nonvolatile memory;
   a third unit including a third nonvolatile memory;
   a fourth unit which issues a first write request for writing first data to the first unit and issues a second write request for writing second data to the second unit; and
   a fifth unit which issues a third write request for writing third data to the first unit and issues a fourth write request for writing fourth data to the third unit, wherein
   the first unit receives the first write request and issues first information to the fourth unit, and the first information is associated with the first data of the first write request and is unique in the first nonvolatile memory,
   the first unit receives the third write request after receiving the first write request and issues, to the fifth unit, third information that is subsequent to the first information, is associated with the third data of the third write request, and is unique in the first nonvolatile memory,
   the second unit receives the second write request and issues second information to the fourth unit, and the second information is associated with the second data of the second write request and is unique in the second nonvolatile memory, and
   the third unit receives the fourth write request and issues fourth information to the fifth unit, and the fourth information is associated with the fourth data of the fourth write request and is unique in the third nonvolatile memory.

2. The storage system of claim 1, wherein
   the fourth unit stores the first information and the second information,
   the fifth unit stores the third information and the fourth information,
   the first unit writes the first information and the first data associated with the first information, to the first nonvolatile memory, and writes the third information and the third data associated with the third information, to the first nonvolatile memory after writing the first information and the first data associated with the first information,
   the second unit writes the second information and the second data associated with the second information, to the second nonvolatile memory, and
   the third unit writes the fourth information and the fourth data associated with the fourth information, to the fourth nonvolatile memory.

3. The storage system of claim 2, wherein
   the fourth unit issues a first read request to the first unit, wherein the first read request specifies the first information,
   the first unit reads the first data associated with the first information from the first nonvolatile memory based on the first information specified in the first read request,
   the fifth unit issues a second read request to the first unit, wherein the second read request specifies the third information, and
   the first unit reads the third data associated with the third information from the first nonvolatile memory based on the third information specified in the second read request.

4. The storage system of claim 3, wherein
   the first unit transmits, to the fourth unit, the first data which is read from the first nonvolatile memory, and
   the first unit transmits, to the fifth unit, the third data which is read from the first nonvolatile memory.

5. The storage system of claim 1, wherein
   the first unit further issues fifth information that is associated with backup data stored in the first nonvolatile memory, indicates that the associated backup data is backed up, and is unique in the first nonvolatile memory.

6. The storage system of claim 5, wherein
   the fourth unit further issues a fifth write request for writing the backup data to the first unit, and
   the first unit issues, to the fourth unit, the fifth information that is associated with the backup data of the fifth write request.

7. The storage system of claim 6, wherein
   the fourth unit stores the fifth information, and
   the first unit writes the fifth information and the backup data associated with the fifth information, to the first nonvolatile memory.

8. The storage system of claim 7, wherein
   the fourth unit issues a third read request to the first unit, wherein the third read request specifies the fifth information, and
   the first unit reads, based on the fifth information specified in the third read request, the backup data associated with the fifth information from the first nonvolatile memory.

9. The storage system of claim 8, wherein
   the first unit transmits, to the fourth unit, the backup data which is read from the first nonvolatile memory.

10. The storage system of claim 1, wherein
   the fourth unit further issues sixth and seventh write requests for writing sixth data to the storage system, the sixth write request is issued to the first unit for writing a first part of the sixth data, the seventh write request is issued to the second unit for writing a second part of the sixth data, and the second part follows the first part,
   the first unit further issues, to the fourth unit, sixth information that is associated with the first part of the sixth data of the sixth write request and is unique in the first nonvolatile memory, and
   the second unit issues, to the fourth unit, seventh information that is associated with the second part of the sixth data of the seventh write request and is unique in the second nonvolatile memory.

11. The storage system of claim 1, wherein
the first unit and the second unit are connected,
the first unit and the fourth unit are connected,
the second unit and the third unit are connected,
the second unit and the fifth unit are connected,
the fourth unit issues the second write request to the second unit via the first unit,
the second unit issues the second information to the fourth unit via the first unit,
the fifth unit issues the third write request to the first unit via the second unit,
the first unit issues the third information to the fifth unit via the second unit,
the fifth unit issues the fourth write request to the third unit via the second unit, and
the third unit issues the fourth information to the fifth unit via the second unit.

12. The storage system of claim 11, wherein
the first unit and the second unit are connected through a first type interface,
the second unit and the third unit are connected through the first type interface,
the first unit and the fourth unit are connected through a second type interface, and
the second unit and the fifth unit are connected through the second type interface.

13. The storage system of claim 1, wherein
the fourth unit is connectable to an external apparatus,
the fifth unit is connectable to the external apparatus,
the fourth unit issues the first write request to the first unit when receiving a first request for writing data including the first data to the storage system, from the external apparatus through a network,
the fourth unit issues the second write request to the second unit when receiving a second request for writing data including the second data to the storage system, from the external apparatus through the network,
the fifth unit issues the third write request to the first unit when receiving a third request for writing data including the third data to the storage system, from the external apparatus through the network, and
the fifth unit issues the fourth write request to the third unit when receiving a fourth request for writing data including the fourth data to the storage system, from the external apparatus through the network.

14. A storage system comprising:
a first unit which includes a first nonvolatile memory;
a second unit which includes a second nonvolatile memory and is connected to the first unit;
a third unit which includes a third nonvolatile memory and is connected to the second unit;
a fourth unit which is connected to the first unit; and
a fifth unit which is connected to the second unit, wherein
the fourth unit issues first and second write requests for writing first data to the storage system, the first write request is issued to the first unit for writing a first part of the first data, the second write request is issued to the second unit for writing a second part of the first data via the first unit, and the second part follows the first part,
the fifth unit issues a third write request for writing third data to the storage system and a fourth write request for writing fourth data to the storage system, the third write request is issued to the first unit for writing the third data, and the fourth write request is issued to the third unit for writing the fourth data,
the first unit receives the first write request and issues, to the fourth unit, first information that is associated with the first part of the first data of the first write request and is unique in the first nonvolatile memory,
the second unit receives the second write request and issues, to the fourth unit via the first unit, second information that is associated with the second part of the first data of the second write request and is unique in the second nonvolatile memory,
the first unit receives the third write request and issues, to the fifth unit via the second unit, third information that is associated with the third data of the third write request and is unique in the first nonvolatile memory, and
the third unit receives the fourth write request and issues, to the fifth unit via the second unit, fourth information that is associated with the fourth data of the fourth write request and is unique in the third nonvolatile memory.

15. The storage system of claim 14, wherein
the fourth unit stores the first information and the second information,
the fourth unit causes the first unit to write the first information, and the first part of the first data and the second information that are associated with the first information, to the first nonvolatile memory,
the fourth unit causes the second unit to write the second information and the second part of the first data associated with the second information, to the second nonvolatile memory,
the fifth unit stores the third information and the fourth information,
the fifth unit causes the first unit to write the third information and the third data associated with the third information, to the first nonvolatile memory, and
the fifth unit causes the third unit to write the fourth information and the fourth data associated with the fourth information, to the third nonvolatile memory.

16. The storage system of claim 15, wherein
the fourth unit issues a first read request to the first unit, wherein the first read request specifies the first information,
the first unit reads the first part of the first data and the second information that are associated with the first information, from the first nonvolatile memory based on the first information specified in the first read request, transmits the read first part of the first data to the fourth unit, and issues a second read request to the second unit, wherein the second read request specifies the read second information, and
the second unit reads the second part of the first data that is associated with the second information from the second nonvolatile memory based on the second information specified in the second read request and transmits the read second part of the first data to the fourth unit via the first unit.

17. The storage system of claim 10, wherein
the fourth unit stores the sixth information and the seventh information,
the first unit writes the sixth information, and the first part of the sixth data and the seventh information that are associated with the sixth information, to the first nonvolatile memory, and
the second unit writes the seventh information and the second part of the sixth data associated with the seventh information, to the second nonvolatile memory.

18. The storage system of claim 14, wherein
the fourth unit issues a fifth write request for writing fifth data to the first unit,
the fifth unit issues a sixth write request for writing sixth data to the first unit via the second unit,
the first unit receives the fifth write request and issues, to the fourth unit, fifth information that is associated with the fifth data of the fifth write request and is unique in the first nonvolatile memory, and
the first unit receives the sixth write request after receiving the fifth write request and issues, to the fifth unit via the second unit, sixth information that is subsequent to the fifth information, is associated with the sixth data of the sixth write request, and is unique in the first nonvolatile memory.

19. The storage system of claim 18, wherein
the fourth unit stores the fifth information,
the fifth unit stores the sixth information,
the first unit writes the fifth information and the fifth data associated with the fifth information, to the first nonvolatile memory, and writes the sixth information and the sixth data associated with the sixth information, to the first nonvolatile memory after writing the fifth information and the fifth data associated with the fifth information.

20. The storage system of claim 14, wherein
the first unit and the second unit are connected through a first type interface,
the second unit and the third unit are connected through the first type interface,
the first unit and the fourth unit are connected through a second type interface, and
the second unit and the fifth unit are connected through the second type interface.

21. The storage system of claim 14, wherein
the fourth unit is connectable to an external apparatus,
the fifth unit is connectable to the external apparatus,
the fourth unit issues the first write request to the first unit and the second write request to the second unit when receiving a first request for writing data including the first data to the storage system, from the external apparatus through a network,
the fifth unit issues the third write request to the first unit when receiving a second request for writing data including the third data to the storage system, from the external apparatus through the network, and
the fifth unit issues the fourth write request to the third unit when receiving a third request for writing data including the fourth data to the storage system, from the external apparatus through the network.

* * * * *